(12) United States Patent
Ishii

(10) Patent No.: US 10,068,641 B2
(45) Date of Patent: Sep. 4, 2018

(54) SEMICONDUCTOR STORAGE DEVICE

(71) Applicant: Renesas Electronics Corporation, Koutou-ku, Tokyo (JP)

(72) Inventor: Yuichiro Ishii, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/894,757

(22) Filed: Feb. 12, 2018

(65) Prior Publication Data

US 2018/0166132 A1 Jun. 14, 2018

Related U.S. Application Data

(63) Continuation of application No. 15/619,821, filed on Jun. 12, 2017, now Pat. No. 9,928,901, which is a (Continued)

(30) Foreign Application Priority Data

Mar. 3, 2014 (JP) .................................. 2014-040521

(51) Int. Cl.
  *G11C 11/419* (2006.01)
  *G11C 7/12* (2006.01)
  *G11C 5/14* (2006.01)

(52) U.S. Cl.
  CPC ............ *G11C 11/419* (2013.01); *G11C 5/148* (2013.01); *G11C 7/12* (2013.01); *G11C 2207/2227* (2013.01)

(58) Field of Classification Search
  CPC ......... G11C 5/148; G11C 7/12; G11C 11/419; G11C 2207/2227
  See application file for complete search history.

(56) References Cited

U.S. PATENT DOCUMENTS 4,379,344 A  4/1983 Ozawa et al.
5,062,079 A  10/1991 Tsuchida et al.
(Continued)

FOREIGN PATENT DOCUMENTS

JP  2000-036190 A  2/2000
JP  2004-206745 A  7/2004
(Continued)

OTHER PUBLICATIONS

Office Action, dated Jul. 18, 2017, in Japanese Patent Application No. 2014-040521.

*Primary Examiner* — Harry W Byrne
*Assistant Examiner* — R Lance Reidlinger
(74) *Attorney, Agent, or Firm* — Shapiro, Gabor and Rosenberger, PLLC

(57) ABSTRACT

A semiconductor storage device includes an SRAM memory cell composed of a drive transistor, a transfer transistor and a load transistor, an I/O circuit that is connected to bit lines connected to the memory cell, and an operating mode control circuit that switches an operating mode of the I/O circuit between a resume standby mode and a normal operation mode, wherein the I/O circuit includes a write driver that writes data to bit lines, a sense amplifier that reads data from the bit lines, a first switch inserted between the bit lines and the write driver, a second switch inserted between the bit lines and the sense amplifier, a precharge circuit that precharges the bit lines, and a control circuit that controls the first and second switches and the precharge circuit according to a signal from the operating mode control circuit.

10 Claims, 11 Drawing Sheets

Related U.S. Application Data continuation of application No. 15/181,175, filed on Jun. 13, 2016, now Pat. No. 9,704,566, which is a continuation of application No. 14/942,861, filed on Nov. 16, 2015, now Pat. No. 9,390,789, which is a continuation of application No. 14/634,743, filed on Feb. 28, 2015, now Pat. No. 9,196,353.

(56) References Cited

U.S. PATENT DOCUMENTS

| | | |
|---|---|---|
| 5,710,738 A | 1/1998 | Tai |
| 5,982,688 A | 11/1999 | Han |
| 6,046,948 A | 4/2000 | Zheng et al. |
| 6,081,468 A | 6/2000 | Taira et al. |
| 6,333,874 B2 | 12/2001 | Yamauchi |
| 6,373,760 B1 | 4/2002 | Ohbayashi |
| 6,449,204 B1 | 9/2002 | Arimoto et al. |
| 7,113,421 B2 | 9/2006 | Maeda et al. |
| 7,200,030 B2 | 4/2007 | Yamaoka et al. |
| 7,660,176 B2 | 2/2010 | Hur |
| 8,675,439 B2 | 3/2014 | Cheng et al. |
| 8,947,968 B2 * | 2/2015 | Chen ............... G11C 11/417 365/203 |
| 9,013,939 B2 | 4/2015 | Yamagami |
| 9,159,398 B2 * | 10/2015 | Mok ............... G11C 11/4076 |
| 9,196,353 B2 | 11/2015 | Ishii |
| 2008/0285367 A1 | 11/2008 | Jung et al. |
| 2013/0265836 A1 | 10/2013 | Seningen et al. |

FOREIGN PATENT DOCUMENTS

| | | |
|---|---|---|
| JP | 2010-528401 T | 8/2010 |
| JP | 2010-198729 A | 9/2010 |

\* cited by examiner

SEMICONDUCTOR STORAGE DEVICE

CROSS-REFERENCE TO RELATED APPLICATIONS

This application is based upon and claims the benefit of priority from Japanese patent application No. 2014-040521, filed on Mar. 3, 2014, the disclosure of which is incorporated herein in its entirety by reference.

BACKGROUND

The present invention relates to a semiconductor storage device.

In SRAM (Static Random Access Memory), which is one of semiconductor storage devices, various proposals are made for reduction of a leakage current.

For example, a technique that reduces a leakage current by raising the source potential of a memory cell to be higher than the VSS level during SRAM resume standby is proposed (Japanese Unexamined Patent Application Publication No. 2004-206745). In this technique, 0.4V is applied to the source of the memory cell. On the other hand, 1.0V is applied as a power supply potential to bit lines.

Besides, a technique that sets bit lines in floating state during resume standby in order to prevent an excessive leakage current from flowing due to a hardware defect such as fixation of a memory cell internal node to Low level is proposed (Japanese Unexamined Patent Application Publication No. 2010-198729).

In the resume standby mode of a resume standby circuit, a channel leakage is reduced by raising the source potential of a memory cell to be higher than the VSS level, thereby reducing a leakage current of the whole module. In this mode, a voltage at the VDD level or the level lower than VDD by NMOS Vth is applied to the bit lines. On the other hand, in the recent microfabrication process, a leakage current to the substrate of an access transistor through the bit lines is large due to GIDL (Gate Induced Drain Leakage), and particularly at room temperature, a leakage current cannot be sufficiently reduced in a normal resume standby circuit.

SUMMARY

The present inventor has found that the above-described techniques have the following problems. In the recent microfabrication process, a leakage current to the substrate of an access transistor through bit lines is not negligible due to GIDL (Gate Induced Drain Leakage). Particularly, at room temperature, the GIDL component is dominant compared with the channel leakage component. Therefore, in the resume standby circuit that raises the source potential of the memory cell to be higher than the VSS level disclosed in Japanese Unexamined Patent Application Publication No. 2004-206745, the leakage current cannot be effectively reduced at room temperature. Further, if the bit lines are set to floating during resume standby as disclosed in Japanese Unexamined Patent Application Publication No. 2010-198729, a leakage current through the bit lines due to GIDL, not only a hardware defect, can be reduced. However, the source potential of the memory cell is at the VSS level in Japanese Unexamined Patent Application Publication No. 2010-198729, and a leakage current cannot be effectively reduced at high temperature. Another problem of setting the bit lines to floating is an increase in a peak current at time of resume return. If the bit lines are set to floating, the bit line potential decreases to the VSS level due to a leakage current or the like in some cases. When returning from the resume standby mode to the normal operation mode, the bit lines are charged from the VSS level to the VDD level by a precharge transistor. In the normal operation, the number of bit lines to be charged is one bit line pair for each MUX (Y-address multiplexer) and either one of True/Bar, and thus the number of bit lines to be charged at a time is limited to the number of all bit lines/MUX/2. On the other hand, when returning from the resume standby mode to the normal operation mode, there is a possibility that all bit lines are charged at the same time. Because the precharge transistor needs to charge the bit lines to the VDD level in one cycle during the normal operation, it is designed to have a considerably large size. Therefore, if the precharge transistor charges all bit lines at the same time, a significantly large peak current flows, which can cause the occurrence of an instantaneous voltage drop. FIG. 11 is a diagram schematically showing a voltage drop during precharge of a semiconductor storage device. A voltage drop can cause the occurrence of a malfunction in another analog circuit, logic circuit or the like in the vicinity, for example. Further, it can cause a reliability defect such as electromigration.

The other problems and novel features of the present invention will become apparent from the description of the specification and the accompanying drawings.

A semiconductor device according to one embodiment includes an SRAM memory cell, an I/O circuit connected to bit lines, and an operating mode control circuit that switches an operating mode of the I/O circuit. The I/O circuit includes a write driver, a sense amplifier, a first switch inserted between the bit lines and the write driver, a second switch inserted between the bit lines and the sense amplifier, a precharge circuit that precharges the bit lines, and a control circuit that controls the first and second switches and the precharge circuit. The control circuit turns off the first and second switches and the precharge circuit in the resume standby mode, and causes the precharge circuit to precharge the bit lines with a smaller driving force compared with in the normal operation mode when returning from the resume standby mode to the normal operation mode.

According to one embodiment, it is possible to reduce a leakage current and suppress a bit line precharge current when switching operating mode in a semiconductor storage device.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

The preferred embodiments of the present invention will be described hereinafter in detail with reference to the drawings. It is noted that in the description of the drawings the same elements will be denoted by the same reference symbols and redundant description will be omitted.

First Embodiment

Figure 1:
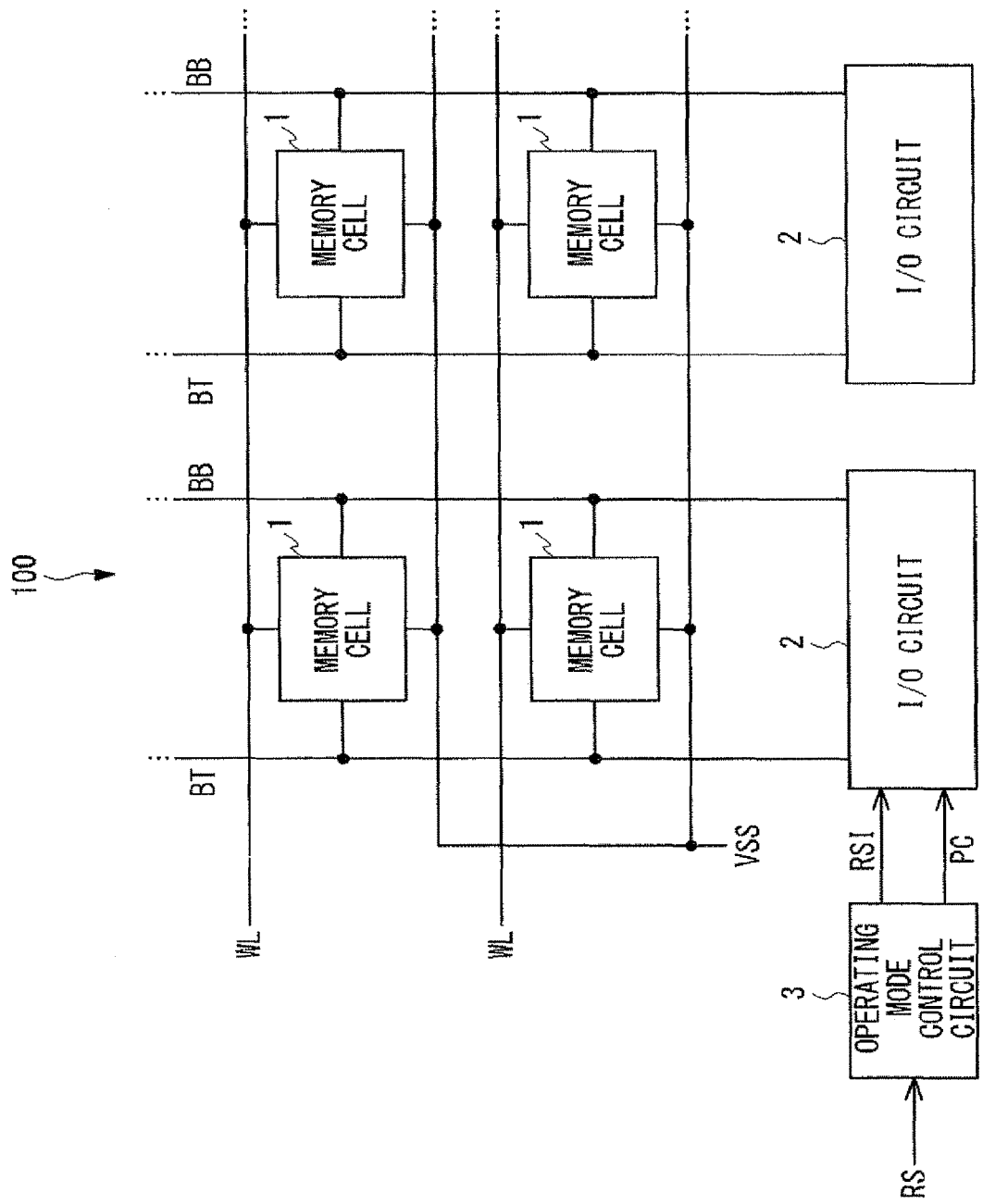
FIG. 1 is a block diagram schematically showing a configuration of a semiconductor storage device according to a first embodiment.
Figure 2:
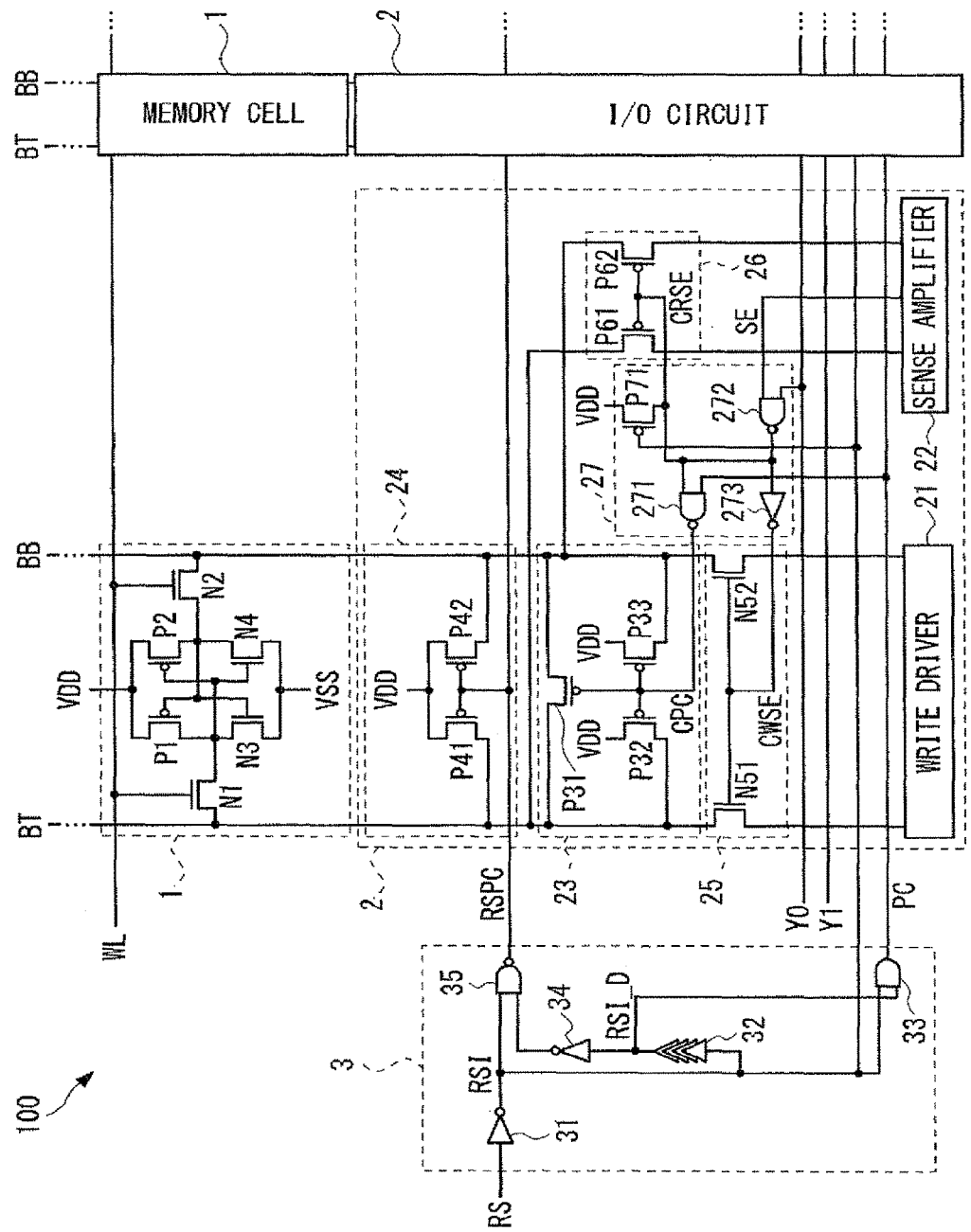
FIG. 2 is a circuit diagram showing in more detail a configuration of the semiconductor storage device according to the first embodiment.

A semiconductor storage device 100 according to a first embodiment is described hereinafter. FIG. 1 is a block diagram schematically showing a configuration of the semiconductor storage device 100 according to the first embodiment. FIG. 2 is a circuit diagram showing in more detail a configuration of the semiconductor storage device 100 according to the first embodiment. As shown in FIGS. 1 and 2, the semiconductor storage device 100 is configured as SRAM. The semiconductor storage device 100 includes a memory cell 1, an I/O circuit 2, and an operating mode control circuit 3.

The semiconductor storage device 100 includes a plurality of memory cells, a plurality of word lines, and a plurality of bit line pairs. Note that, however, because the configuration of the memory cells, the word lines and the bit line pairs are respectively the same, each of the plurality of memory cells, the plurality of word lines, and the plurality of bit line pairs is not distinguished from one another in the following embodiments.

The memory cell 1 includes NMOS transistors N1 to N4 and PMOS transistors P1 and P2. In the memory cell 1, the NMOS transistors N1 and N2 function as transfer transistors, The NMOS transistors N3 and N4 function as drive transistors. The PMOS transistors P1 and P2 function as loads.

The drain of the NMOS transistor N1 is connected to the bit line BT. The drain of the NMOS transistor N2 is connected to the bit line BB. The gates of the NMOS transistors N1 and N2 are connected to the word line WL. A power supply potential VDD is applied to the sources of the PMOS transistors P1 and P2. The drain of the PMOS transistor P1 is connected to the source of the NMOS transistor N1, the drain of the NMOS transistor N3 and the gates of the NMOS transistor N4 and the PMOS transistor P2. The drain of the PMOS transistor P2 is connected to the source of the NMOS transistor N2, the drain of the NMOS transistor N4, and the gates of the NMOS transistor N3 and the PMOS transistor P1. The sources of the NMOS transistors N3 and N4 are connected to the ground (ground potential VSS).

The I/O circuit 2 includes a write driver 21, a sense amplifier 22, a normal operation precharge circuit 23, a resume standby return precharge circuit 24, a write column switch 25, a read column switch 26, and a column I/O control circuit 27.

The write driver 21 writes data to the bit line BT and the bit line BB. The sense amplifier 22 reads data from the bit line BT and the bit line BB.

The normal operation precharge circuit 23 includes PMOS transistors P31 to P33. One end of the PMOS transistor P31 is connected to the bit line BT and the other end is connected to the bit line BB. The power supply potential VDD is applied to the sources of the PMOS transistors P32 and P33. The drain of the PMOS transistor P32 is connected to the bit line BT. The drain of the PMOS transistor P33 is connected to the bit line BB. A precharge control signal CPC is input to the gates of the PMOS transistors P31 to P33 from the column I/O control circuit 27.

The resume standby return precharge circuit 24 includes PMOS transistors P41 and P42. The power supply potential VDD is applied to the sources of the PMOS transistors P41 and P42. The drain of the PMOS transistor P41 is connected to the bit line BT. The drain of the PMOS transistor P42 is connected to the bit line BB. A resume mode return precharge signal RSPC is input to the gates of the PMOS transistors P41 and P42 from the operating mode control circuit 3.

The write column switch 25 includes NMOS transistors N51 and N52. One end of the NMOS transistors N51 is connected to the bit line BT and the other end is connected to the write driver 21. One end of the NMOS transistors N52 is connected to the bit line BB and the other end is connected to the write driver 21. A write switch control signal CWSE is input to the gates of the NMOS transistors N51 and N52 from the column I/O control circuit 27.

The read column switch 26 includes PMOS transistors P61 and P62. One end of the PMOS transistor P61 is connected to the bit line BT and the other end is connected to the sense amplifier 22. One end of the PMOS transistor P62 is connected to the bit line BB and the other end is connected to the sense amplifier 22. A read switch control signal CRSE is input to the gates of the PMOS transistors P61 and P62 from the column I/O control circuit 27.

The column I/O control circuit 27 includes a PMOS transistor P71, NAND circuits 271 and 272 and an inverter 273. The power supply potential VDD is applied to the source of the PMOS transistor P71. An inverted operating mode switching signal RSI is input to the gate of the PMOS transistor P71. A precharge signal PC is input to one input terminal of the NAND circuit 271, and the output terminal is connected to the gates of the PMOS transistors P31 to P33 in the normal operation precharge circuit 23 and outputs the precharge control signal CPC. A Y-selection signal Y0 is input to one input terminal of the NAND circuit 272, and a sense enable signal SE from the sense amplifier 22 is input to the other input terminal. The output terminal of the inverter 273 is connected to the gates of the NMOS transistors N51 and N52 in the write column switch 25 and outputs the write switch control signal CWSE. The drain of the PMOS transistor P71, the gates of the PMOS transistors P61 and P62 in the read column switch 26, the other input terminal of the NAND circuit 271, the output terminal of the NAND circuit 272 and the input terminal of the inverter 273 are connected to each other.

The operating mode control circuit 3 includes an inverter 31, a delay circuit 32, an AND circuit 33, an inverter 34 and a NAND circuit 35. An operating mode switching signal RS is input to the input terminal of the inverter 31, and an inverted operating mode switching signal RSI, which is an inverted signal of the operating mode switching signal RS, is output from the output terminal. The input terminal of the delay circuit 32 is connected to the output terminal of the inverter 31 and receives the inverted operating mode switching signal RSI. A delayed inverted operating mode switching signal RSI_D, which is generated by delaying the inverted operating mode switching signal RSI, is output from the output terminal of the delay circuit 32. One input terminal of the AND circuit 33 is connected to the output terminal of the inverter 31 and receives the inverted operating mode switching signal RSI. The other input terminal of the AND circuit 33 is connected to the output terminal of the delay circuit 32 and receives the delayed inverted operating mode switching signal RSI_D. The precharge signal PC is output from the output terminal of the AND circuit 33. The input terminal of the inverter 34 is connected to the output terminal of the delay circuit 32 and receives the delayed inverted operating mode switching signal RSI_D, and the output terminal is connected to one input terminal of the NAND circuit 35. The other input terminal of the NAND circuit 35 is connected to the output terminal of the inverter 31 and receives the inverted operating mode switching signal RSI. The output terminal of the NAND circuit 35 is connected to the gates of the PMOS transistors P41 and P42 in the resume standby return precharge circuit 24 and outputs the resume mode return precharge signal RSPC. Further, the inverted operating mode switching signal RSI is output to the gate of the PMOS transistor P71 in the column I/O control circuit 27.

Figure 3:
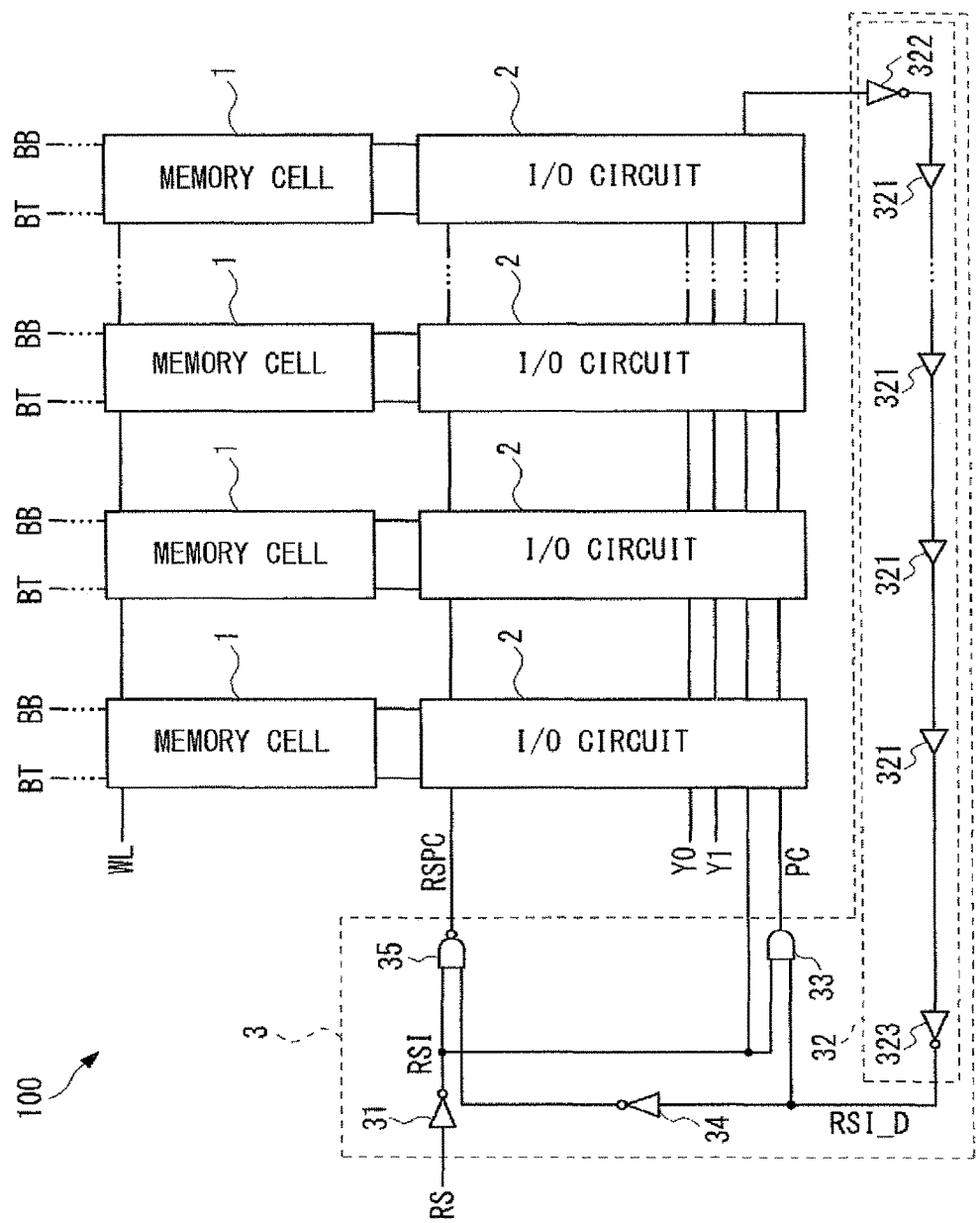
FIG. 3 is a diagram showing a configuration example of a delay circuit.

Note that the delay circuit 32 can be configured as follows, for example. FIG. 3 is a diagram showing a configuration example of the delay circuit 32. The delay circuit 32 includes buffers 321, an inverter 322 and an inverter 323.

The inverter 322 is placed in the position where it can receive supply of the inverted operating mode switching signal RSI having passed through the memory cell in the semiconductor storage device 100. In this position, the inverted operating mode switching signal RSI is input to the input terminal of the inverter 322.

The buffers 321 are placed respectively in near proximity to the plurality of I/O circuits 2 corresponding to the plurality of memory cells 1 in the semiconductor storage device 100. The plurality of buffers 321 are connected in cascade. The input terminal of the plurality of buffers 321 connected in cascade is connected to the output terminal of the inverter 322. The output terminal of the plurality of buffers 321 connected in cascade is connected to the input terminal of the inverter 323. The delayed inverted operating mode switching signal RSI_D is output from the output terminal of the inverter 323.

Figure 4:
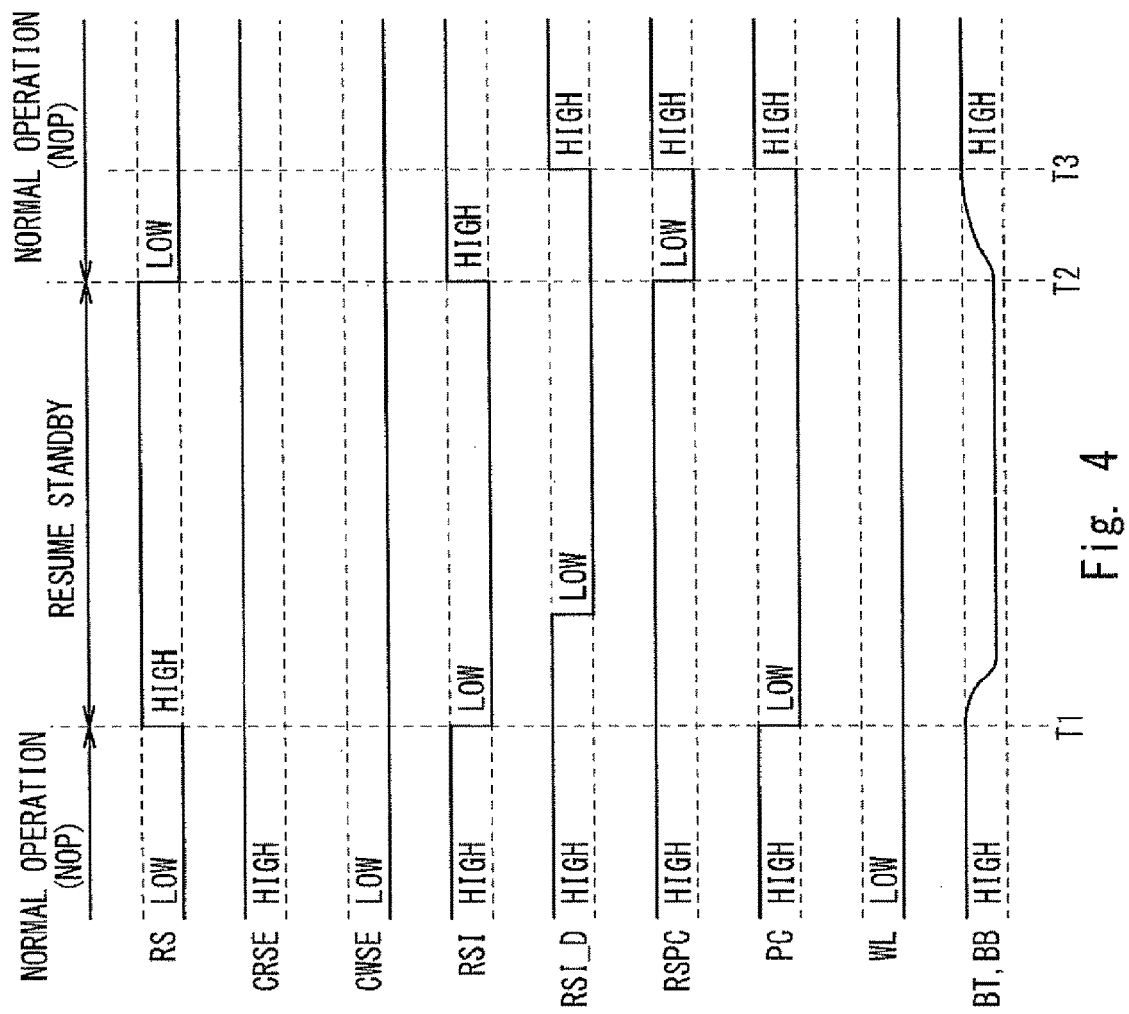
FIG. 4 is a timing chart of signals in the semiconductor storage device according to the first embodiment.

The operation of the semiconductor storage device 100 is described hereinafter. FIG. 4 is a timing chart of signals in the semiconductor storage device 100 according to the first embodiment. The operation in the case of NOP (non-operation) state in the normal operation mode is described first. In this state, the word line WL is Low level, the Y-selection signals Y0 and Y1 are both Low level, and the operating mode switching signal RS is Low level.

Because the Y-selection signals Y0 and Y1 are both. Low level, the read switch control signal CRSE is High level. Accordingly, the read column switch 26 is off, and the sense amplifier 22 and the bit line BT and the bit line BB are electrically disconnected from each other.

Because the read switch control signal CRSE is High level, the write switch control signal CWSE is Low level. Accordingly, the write column switch 25 is off, and the write driver 21 and the bit line BT and the bit line BB are electrically disconnected from each other.

Because the operating mode switching signal RS is Low level, the inverted operating mode switching signal RSI is High level, and the delayed inverted operating mode switching signal RSI_D is High level. Accordingly, the resume mode return precharge signal RSPC is High level, and the resume standby return precharge circuit 24 is off.

Because the inverted operating mode switching signal RSI is High level and the delayed inverted operating mode switching signal RSI_D is High level, the precharge signal PC is High level. Because the read switch control signal CRSE is also High level, the precharge control signal CPC is Low level. Accordingly, the normal operation precharge circuit 23 is on, and the bit line BT and the bit line BB are precharged to High level.

As described above, in the NOP state in the normal operation mode, the bit line BT and the bit line BB are kept at High level by the normal operation precharge circuit 23. Note that, in this state, because the sources of the NMOS transistors N3 and N4 in the memory cell 1 are grounded (ground potential VSS), a leakage current flows from the power supply to the ground due to a channel leakage of the load (PMOS transistors P1 and P2), the drive transistor (NMOS transistors N3 and N4) and the transfer transistor (NMOS transistors N1 and N2). Further, a leakage current flows from the bit line (power supply) to the substrate of the transfer transistor (ground) due to GIDL of the transfer transistor.

Next, the operation in the case of transition from the normal operation mode to the resume standby mode (timing T1 in FIG. 4) is described. While the word line WL stays Low level, the operating mode switching signal RS transitions from Low level to High level. Note that, in the resume standby mode, the power supply of an address decoder (not shown) is cut, the Y-selection signals Y0 and Y1 are indeterminate.

The inverted operating mode switching signal RSI transitions from High level to Low level. Although the Y-selection signals Y0 and Y1 are indeterminate, because the PMOS transistor P71 turns on, the read switch control signal CRSE is driven to High level. Accordingly, the read column switch 26 is off, and the sense amplifier 22 and the bit line BT and the bit line BB are electrically disconnected from each other.

Because the read switch control signal CRSE is High level, the write switch control signal CWSE is Low level. Accordingly, the write column switch 25 is off, and the write driver 21 and the bit line BB are electrically disconnected from each other.

Even when the inverted operating mode switching signal RST transitions from High level to Low level, the resume mode return precharge signal RSPC remains High level, and the resume standby return precharge circuit 24 is off.

When the inverted operating mode switching signal RSI transitions from High level to Low level, the precharge signal PC becomes Low level. Accordingly, the precharge control signal CPC becomes High level, and the normal operation precharge circuit 23 is off.

Because the word line WL is Low level, the transfer transistor is off.

As described above, in the resume standby mode, the bit line BT and the bit line BB are electrically disconnected from the other circuits in the semiconductor storage device 100 and are in floating state. Therefore, the potential of the bit line BT and the bit line BB is determined to be the potential at which a leakage current of the memory cell 1 and the other circuits is the smallest. It is therefore possible to reduce a leakage current from the bit line to the substrate of the transfer transistor due to GIDL.

Even when the inverted operating mode switching signal RSI transitions from High level to Low level, the delayed inverted operating mode switching signal RSI_D does not immediately transition from High level to Low level. Specifically, the delayed inverted operating mode switching signal RSI_D transitions from High level to Low level after the lapse of a certain delay time from when the inverted operating mode switching signal RSI transitions from High level to Low level.

As described above, in the resume standby mode, the bit line BT and the bit line BB are in floating state, and therefore a leakage current from the bit line to the substrate of the transfer transistor due to GIDL can be reduced.

Next, the operation in the case of returning from the resume standby mode to the normal operation mode (timing T2 in FIG. 4) is described. While the word line WL stays Low level, the operating mode switching signal RS transitions from High level to Low level. Note that, the power supply of the address decoder is also cut, though not shown. Therefore, the Y-selection signals Y0 and Y1 are indeterminate. After a certain period of time at which the power supply is restored, the Y-selection signals Y0 and Y1 become Low level.

The inverted operating mode switching signal RSI transitions from Low level to High level. Although the Y-selection signals Y0 and Y1 are indeterminate initially, they transition to Low level after a certain period of time, and the read switch control signal CRSE is driven to High level. Accordingly, the read column switch 26 is off, and the sense amplifier 22 and the bit line BT and the bit line BB are electrically disconnected from each other.

Because the read switch control signal CRSE is High level, the write switch control signal CWSE is Low level. Accordingly, the write column switch 25 is off, and the write driver 21 and the bit line BT and the bit line BB are electrically disconnected from each other.

Even when the inverted operating mode switching signal RSI transitions from Low level to High level, the delayed inverted operating mode switching signal RSI_D does not immediately transition from Low level to High level.

When the inverted operating mode switching signal RSI becomes High level, the resume mode return precharge signal RSPC becomes Low level. Accordingly, the resume standby return precharge circuit 24 turns on, and the bit line BT and the bit line BB are precharged to High level.

Because the delayed inverted operating mode switching signal RSI_D does not immediately transition from Low level to High level, even when the inverted operating mode switching signal RSI becomes High level, the precharge signal PC is kept at Low level. Accordingly, the precharge control signal CPC is kept at High, and the normal operation precharge circuit 23 is also kept off. Therefore, during the period when the bit line BT and the bit line BB are precharged for return by the resume standby return precharge circuit 24, precharge by the normal operation precharge circuit 23 is not performed.

After the lapse of a certain period of time from when the inverted operating mode switching signal RSI transitions from Low level to High level (timing T3 in FIG. 4), the delayed inverted operating mode switching signal RSI_D transitions from Low level to High level. As a result, the resume mode return precharge signal RSPC transitions to High level, and the resume standby return precharge circuit 24 turns off.

On the other hand, the precharge signal PC transitions to High level. Because the read switch control signal CRSE is High level, the precharge control signal CPC transitions to Low level, and the normal operation precharge circuit 23 turns on. The semiconductor storage device 100 thereby returns to the normal operation mode.

As described above, at the time of returning from the resume standby mode to the normal operation mode, the bit line BT and the bit line BB are charged to High level by the resume standby return precharge circuit 24 for a certain period of time after the return. Then, after the lapse of the certain period, the circuit to precharge the bit line BT and the bit line BB changes from the resume standby return precharge circuit 24 to the normal operation precharge circuit 23, and the return to the normal operation mode is thereby completed.

As described above, at the time of returning from the resume standby mode to the normal operation mode, it is necessary to precharge both of the bit line BT and the bit line BB in the semiconductor storage device 100, and therefore a larger current is required for precharge compared with in the normal operation mode. Because a large number of bit lines are included in the semiconductor storage device 100, if they are precharged using the normal operation precharge circuit 23, a peak current required for precharge at the time of returning from the resume standby mode to the normal operation mode is large.

On the other hand, in the semiconductor storage device 100, the driving force of the resume standby return precharge circuit 24 is designed to be smaller than the driving force of the normal operation precharge circuit 23. It is thereby possible to suppress a peak current when performing precharge at the time of returning from the resume standby mode to the normal operation mode.

Accordingly, in this configuration, it is possible to prevent the occurrence of a reliability defect such as power supply potential drop or electromigration compared with the case of using the normal operation precharge circuit for precharge at the time of returning from the resume standby mode to the normal operation mode.

Further, in this configuration, the bit line is in floating state during the resume standby mode as described above. It is thereby possible to reduce a leakage current due to GIDL flowing from the bit line to the substrate of the transfer transistor.

Second Embodiment

Figure 5:
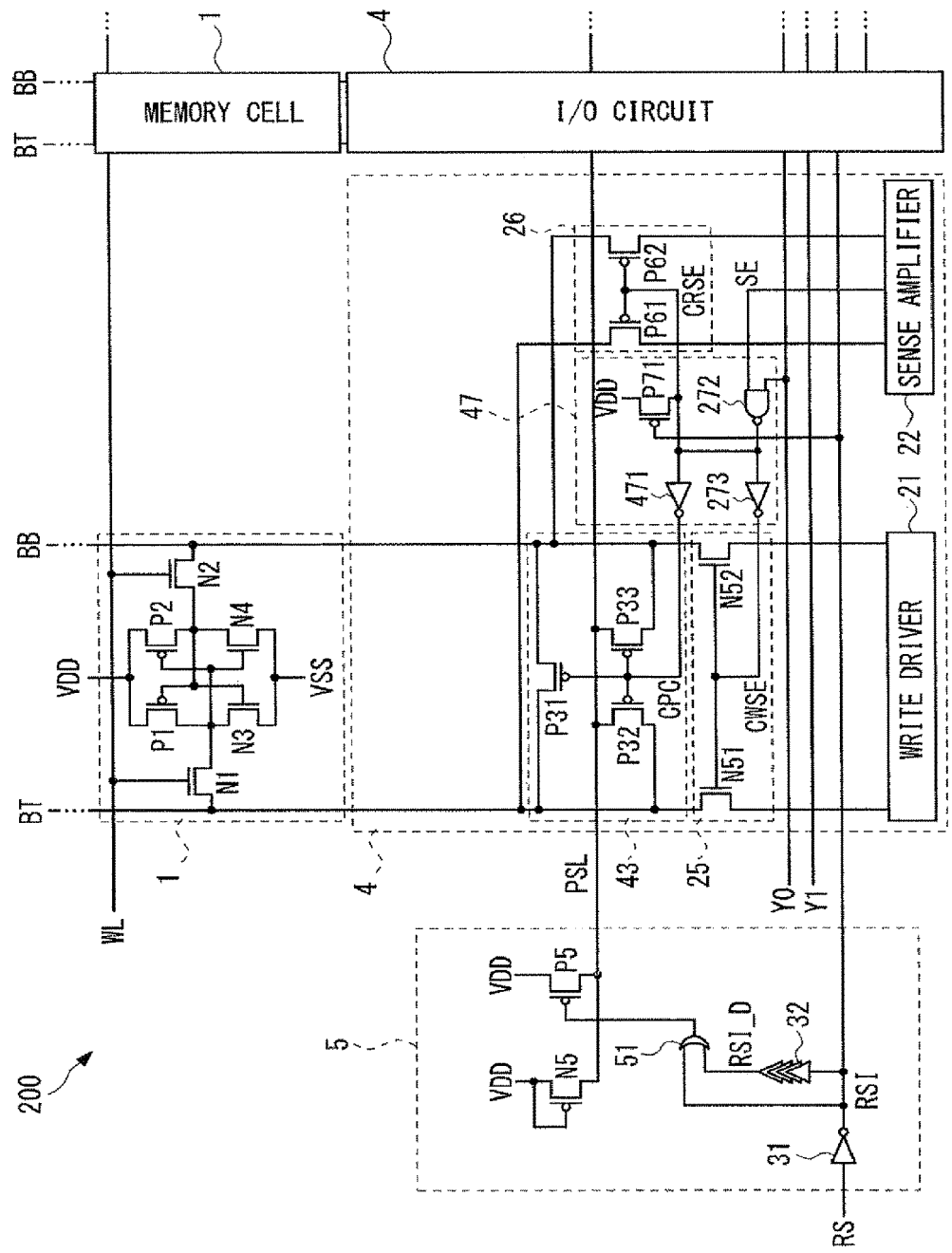
FIG. 5 is a circuit diagram schematically showing a configuration of a semiconductor storage device according to a second embodiment.

A semiconductor storage device 200 according to a second embodiment is described hereinafter. FIG. 5 is a circuit diagram schematically showing a configuration of the semiconductor storage device 200 according to the second embodiment. As shown in FIG. 5, the semiconductor storage device 200 includes a memory cell 1, an I/O circuit 4, and an operating mode control circuit 5.

The I/O circuit 4 has a configuration in which the resume standby return precharge circuit 24 is eliminated from the I/O circuit 2 described in the first embodiment and further the normal operation precharge circuit 23 and the column I/O control circuit 27 are replaced by a normal operation precharge circuit 43 and the column I/O control circuit 47, respectively. The other configuration of the I/O circuit 4 is the same as that of the I/O circuit 2 and thus not redundantly described.

The normal operation precharge circuit 43 has a configuration in which the sources of the PMOS transistors P31 and P32 in the normal operation precharge circuit 23 are connected to a precharge power supply line PSL instead of VDD.

The column I/O control circuit 47 has a configuration in which the NAND circuit 271 in the column I/O control circuit 27 is changed to an inverter 471. The input terminal of the inverter 471, the drain of the PMOS transistor P71, and the gates of the PMOS transistors P61 and P62 in the read column switch 26, the output terminal of the NAND circuit 272, and the input terminal of the inverter 273 are connected to each other. The output terminal of the inverter 471 is connected to the gates of the PMOS transistors P31 to P33 in the normal operation precharge circuit 43 and outputs a precharge control signal CPC. The other configuration of the column I/O control circuit 47 is the same as that of the column I/O control circuit 27 and thus not redundantly described.

The operating mode control circuit 5 includes an inverter 31, a delay circuit 32, an OR circuit 51, an NMOS transistor N5 and a PMOS transistor P5.

The inverter 31 and the delay circuit 32 are the same as those of the operating mode control circuit 3 described in the first embodiment.

The power supply potential VDD is applied to the drain and the gate of the NMOS transistor N5. The source of the NMOS transistor N5 is connected to the precharge power supply line PSL. The power supply potential VDD is applied to the source of the PMOS transistor P5. The drain of the PMOS transistor P5 is connected to the precharge power supply line PSL.

One input terminal of the OR circuit 51 is connected to the output terminal of the inverter 31 and receives the inverted operating mode switching signal RSI. The other input terminal of the OR circuit 51 is connected to the output terminal of the delay circuit 32 and receives the delayed inverted operating mode switching signal RSI_D. The output terminal of the OR circuit 51 is connected to the gate of the PMOS transistor P5.

The operation of the semiconductor storage device 200 is described hereinafter. The timing of signals in the semiconductor storage device 200 is the same as shown in FIG. 4.

In the NOP state in the normal operation mode, the PMOS transistor P5 and the NMOS transistor N5 are on, and the power supply potential VDD is applied to the precharge power supply line PSL.

On the other hand, in the resume standby mode (timing T1 in FIG. 4), the PMOS transistor P5 is off and the NMOS transistor N5 is on. Accordingly, a voltage that is lower than the power supply potential VDD by Vth (threshold) of the NMOS transistor N5 is applied to the precharge power supply line PSL. Because the precharge control signal CPC is High level, the normal operation precharge circuit 43 is off, and the bit line BT and the bit line BB are in floating state.

In the case of returning from the resume standby mode to the normal operation mode (timing T2 in FIG. 4), the PMOS transistor P5 is off and the NMOS transistor N5 is on for a certain period of time. On the other hand, because the precharge control signal CPC is Low level, the bit line BT and the bit line BB are precharged. At this time, the voltage that is lower than the power supply potential VDD by Vth (threshold) of the NMOS transistor N5 is continuously applied to the precharge power supply line PSL. Therefore, precharge of the bit lines is performed slowly, and it is thereby possible to reduce a peak current at the time of precharge, just like the semiconductor storage device 100.

As described above, according to this configuration, when charging the bit lines at the time of returning from the resume standby mode to the normal operation mode, the power supply potential applied to the charging transistor in the normal operation precharge circuit 43 is dropped to reduce the driving capability of the charging transistor. It is thereby possible to suppress a peak current at the time of return, just like the semiconductor storage device 100.

Therefore, in this configuration, the same advantageous effects as the semiconductor storage device 100 according to the first embodiment can be obtained.

Third Embodiment

Figure 6:
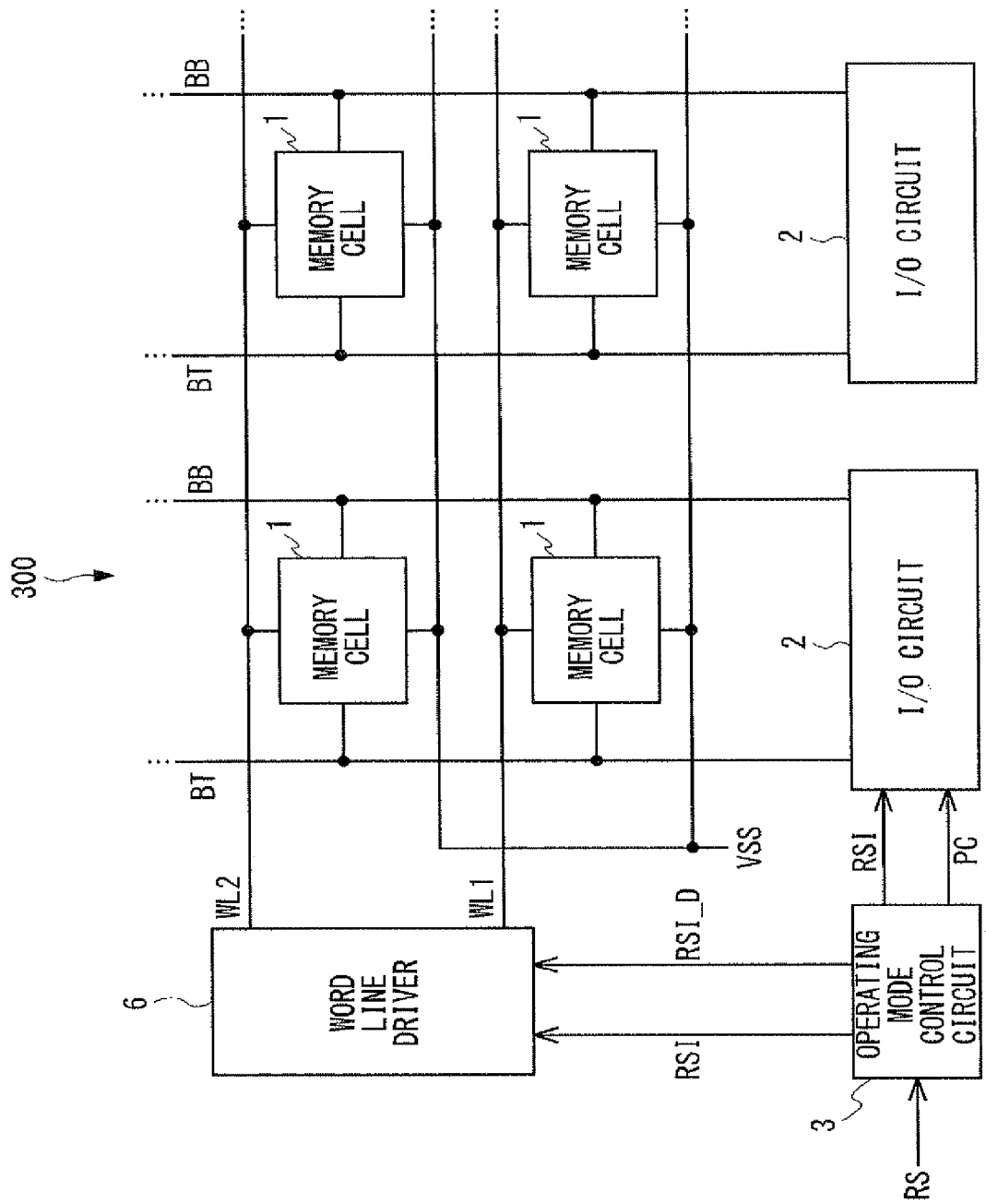
FIG. 6 is a block diagram schematically showing a configuration of a semiconductor storage device according to a third embodiment.

A semiconductor storage device 300 according to a third embodiment is described hereinafter. FIG. 6 is a block diagram schematically showing a configuration of the semiconductor storage device 300 according to the third embodiment. As shown in FIG. 6, the semiconductor storage device 300 has a configuration in which a word line driver 6 is added to the semiconductor storage device 100.

Figure 7:
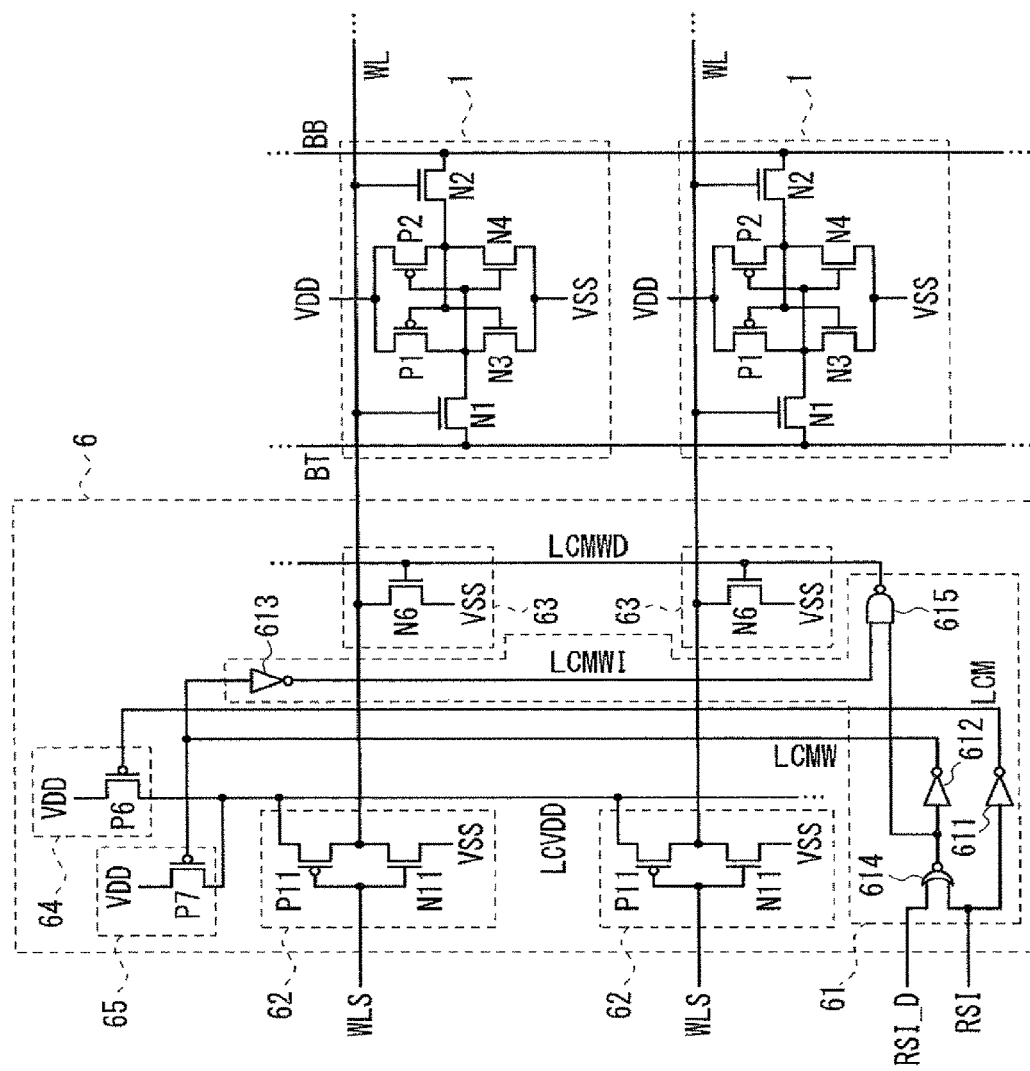
FIG. 7 is a circuit diagram showing a word line driver and a memory cell according to the third embodiment.

FIG. 7 is a circuit diagram showing the word line driver 6 and the memory cell 1 according to the third embodiment. The word line driver 6 includes a control signal generation circuit 61, a driver circuit 62, a resume standby word line holding circuit 63, a return word line power supply switch 64, and a word line power supply switch 65.

The control signal generation circuit 61 includes inverters 611 to 613, a NOR circuit 614 and a NAND circuit 615. The inverted operating mode switching signal RSI is input to the input terminal of the inverter 611 from the operating mode control circuit 3. A return word line power supply switch control signal LCM is output from the output terminal of the inverter 611. The inverted operating mode switching signal RSI is input to one input terminal of the NOR circuit 614 from the operating mode control circuit 3. The delayed inverted operating mode switching signal RSI_D is input to the other input terminal of the NOR circuit 614 from the operating mode control circuit 3. The output terminal of the NOR circuit 614 is connected to the input terminal of the inverter 612 and one input terminal of the NAND circuit 615. A word line power supply switch control signal LCMW is output from the output terminal of the inverter 612. The input terminal of the inverter 613 is connected to the output terminal of the inverter 612 and receives the word line power supply switch control signal LCMW. An inverted word line power supply switch control signal LCMWI is output from the output terminal of the inverter 613 to the other input terminal of the NAND circuit 615. A resume standby word line holding control signal LSMWD is output from the output terminal of the NAND circuit 615.

The return word line power supply switch 64 includes a PMOS transistor P6. The power supply potential VDD is applied to the source of the PMOS transistor P6. The drain of the PMOS transistor P6 is connected to a word line driver power supply line LCVDD. The return word line power supply switch control signal LCM is input to the gate of the PMOS transistor P6.

The word line power supply switch 65 includes a PMOS transistor P7. The power supply potential VDD is applied to the source of the PMOS transistor P7. The drain of the PMOS transistor P7 is connected to the word line driver power supply line LCVDD. The gate of the PMOS transistor P7 is connected to the output terminal of the inverter 612 and receives the word line power supply switch control signal LCMW.

The driver circuit 62 includes a PMOS transistor P11 and an NMOS transistor N11. The PMOS transistor P11 and the NMOS transistor N11 form an inverter circuit. The source of the PMOS transistor P11 is connected to the drain of the PMOS transistor P6 in the return word line power switch 64 and the drain of the PMOS transistor P7 in the word line power supply switch 65 (i.e. the word line driver power supply line LCVDD). The drain of the PMOS transistor P11 is connected to the drain of the NMOS transistor N11 and the word line WL. The source of the NMOS transistor N11 is grounded (ground potential VSS). A word line selection signal WLS is input to the gates of the PMOS transistor P11 and the NMOS transistor N11.

The resume standby word line holding circuit 63 includes an NMOS transistor N6. The drain of the NMOS transistor N6 is connected to the word line WL between the driver circuit 62 and the memory cell 1. The source of the NMOS transistor N6 is grounded (ground potential VSS). The gate of the NMOS transistor N6 is connected to the output terminal of the NAND circuit 615 and receives the resume standby word line holding control signal LSMWD.

Figure 8:
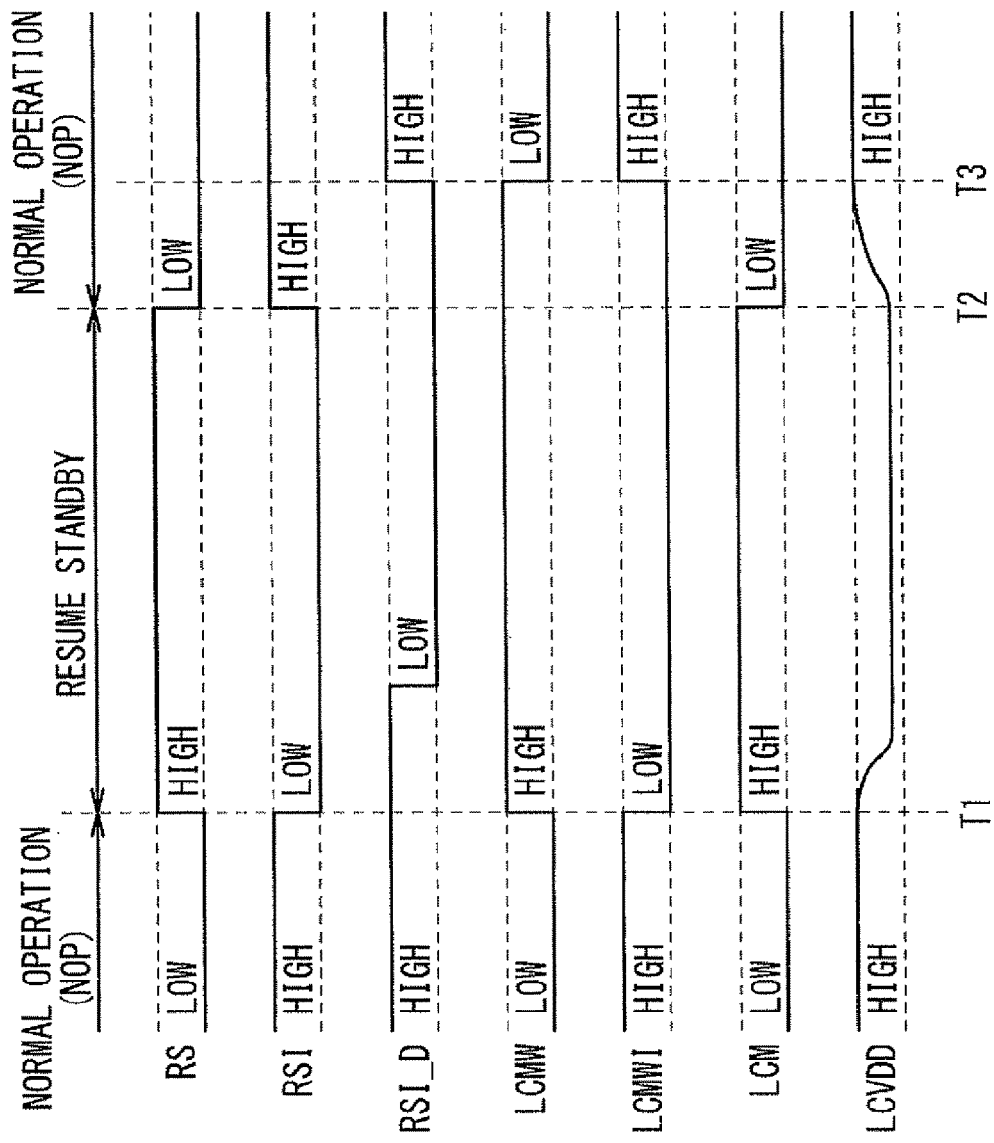
FIG. 8 is a timing chart of signals in the semiconductor storage device according to the third embodiment.

The operation of the semiconductor storage device 300 is described hereinafter. FIG. 8 is a timing chart of signals in the semiconductor storage device 300 according to the third embodiment. First, the operation in the case of the NOP state in the normal operation mode is described. In the NOP state in the normal operation mode, the operating mode switching signal RS is Low level.

At this time, the delayed inverted operating mode switching signal RSI_D is High level, and therefore the word line power supply switch control signal LCMW is Low level. Accordingly, the word line power supply switch 65 is on and drives the word line driver power supply line LCVDD to High level.

At this time, the inverted operating mode switching signal RSI is High level. Accordingly, the return word line power supply switch control signal LCM is Low level, and the return word line power switch 64 is on and drives the word line driver power supply line LCVDD to High level.

Because the word line power supply switch control signal LCMW is Low level, the inverted word line power supply switch control signal LCMWI is High level. Accordingly, the resume standby word line holding control signal LSMWD is Low level, and the resume standby word line holding circuit 63 is off.

As described above, in the normal operation mode, the word line driver power supply line LCVDD is driven to High level by both of the word line power supply switch 65 and the return word line power switch 64.

Next, the operation in the case of transition from the normal operation mode to the resume standby mode (timing T1 in FIG. 8) is described. At this time, the operating mode switching signal RS transitions from Low level to High level.

Because the operating mode switching signal RS becomes High level, the word line power supply switch control signal LCMW becomes High level, and the word line power supply switch 65 turns off.

Because the inverted operating mode switching signal RSI becomes Low level, the return word line power supply switch control signal LCM becomes High level, and the return word line power switch 64 turns off.

Because the word line power supply switch control signal LCMW becomes High level, the inverted word line power supply switch control signal LCMWI becomes Low level. Accordingly, the resume standby word line holding control signal LSMWD becomes High level, and the resume standby word line holding circuit 63 turns on, and all of the word lines WL are held at Low level.

As described above, in the resume standby mode, the word line driver power supply line LCVDD is floating, thereby reducing a leakage current in the driver circuit 62. Further, the word lines WL are held at Low level by the resume standby word line holding circuit 63, instead of the driver circuit 62.

Next, the operation in the case of returning from the resume standby mode to the normal operation mode (timing T2 in FIG. 8) is described. At this time, the operating mode switching signal RS transitions from High level to Low level.

Even when the operating mode switching signal RS transitions to Low level, the delayed inverted operating mode switching signal RSI_D does not immediately transition from Low level to High level. The word line power supply switch control signal LCMW also does not immediately transition to Low level, and therefore the word line power supply switch 65 remains off.

On the other hand, because the inverted operating mode switching signal RSI becomes High level, the return word line power supply switch control signal LCM immediately becomes Low level, and the return word line power switch 64 turns on, and the word line driver power supply line LCVDD is charged to High level.

After a certain period of time from transition of the inverted operating mode switching signal RSI from Low level to High level (timing T3 in FIG. 8), the delayed inverted operating mode switching signal RSI_D transitions from Low level to High level.

The word line power supply switch control signal LCMW thereby also transitions to Low level, and the word line power supply switch 65 turns on, and the word line driver power supply line LCVDD is driven to High level.

As described above, at the time of returning from the resume standby mode to the normal operation mode, the word line driver power supply line LCVDD is charged to High level by the return word line power switch 64 for a certain period of time after the return. After that, the word line power supply switch 65 turns on, and the return to the normal operation mode is completed. The driving force of the return word line power switch 64 is designed to be sufficiently smaller than the driving force of the word line power supply switch 65 in order to prevent an increase in a peak current when charging the word line driver power supply line LCVDD. Accordingly, the word line driver power supply line LCVDD can be charged slowly compared with the case of using the word line power supply switch 65 for charging. It is thereby possible to prevent the occurrence of an instantaneous voltage drop and a reliability defect due to an increase in a peak current during charging.

Fourth Embodiment

Figure 9:
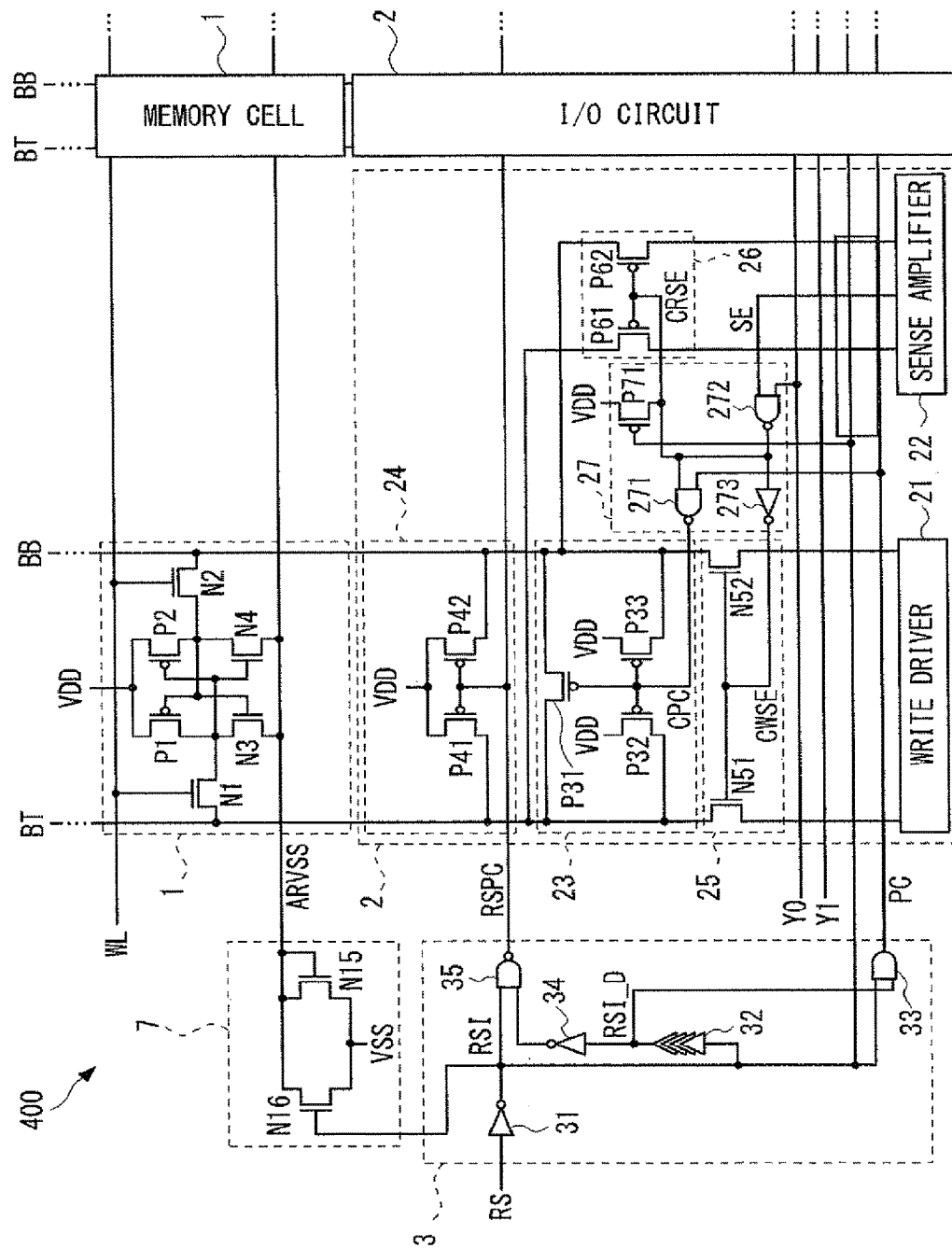
FIG. 9 is a circuit diagram schematically showing a configuration of a semiconductor storage device according to a fourth embodiment.

A semiconductor storage device 400 according to a fourth embodiment is described hereinafter. FIG. 9 is a circuit diagram schematically showing a configuration of the semiconductor storage device 400 according to the fourth embodiment. As shown in FIG. 9, the semiconductor storage device 400 has a configuration in which a source level control circuit 7 is added to the semiconductor storage device 100.

The source level control circuit 7 includes NMOS transistors N15 and N16. The drain and the gate of the NMOS transistor N15 are connected to a source line ARVSS. The drain of the NMOS transistor N16 is connected to the source line ARVSS. The inverted operating mode switching signal RSI output from the operating mode control circuit 3 is input to the gate of the NMOS transistor N16. The sources of the NMOS transistors N15 and N16 are grounded (ground potential VSS).

Figure 10:
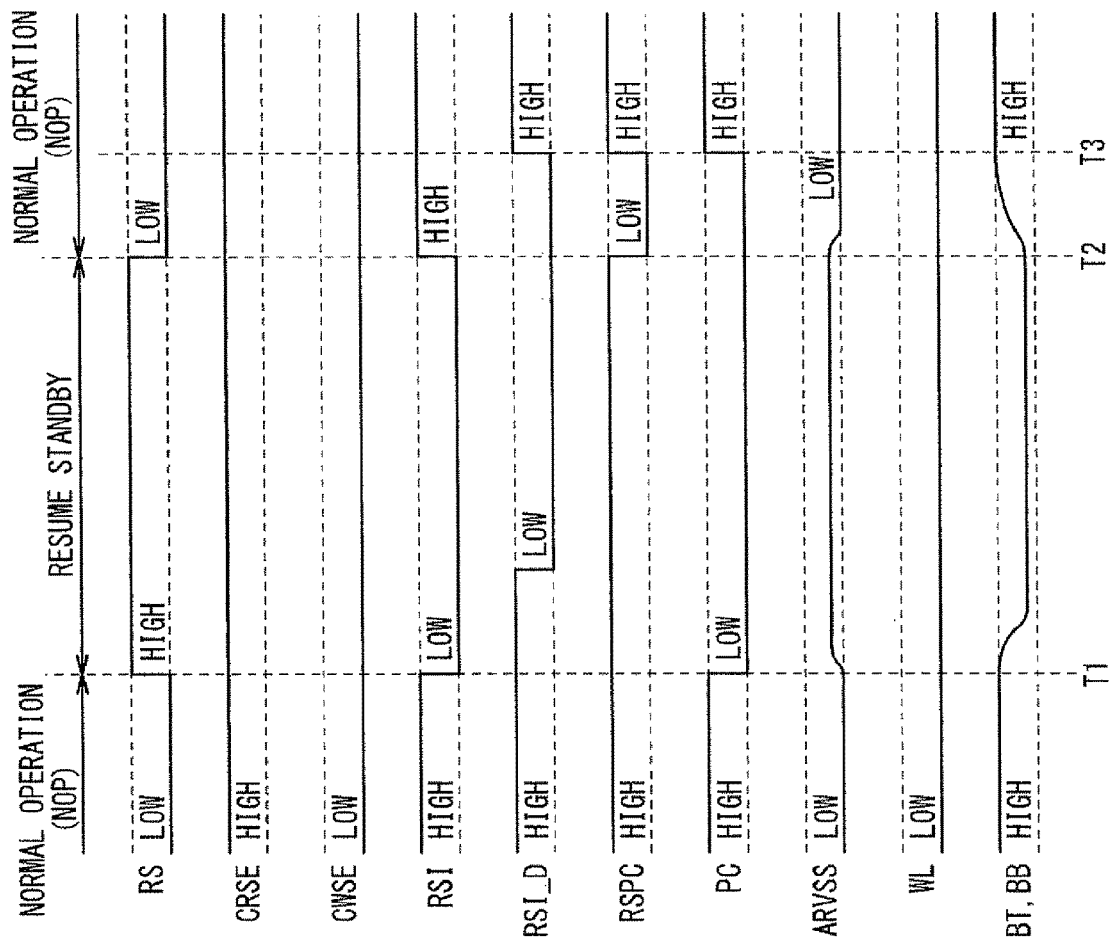
FIG. 10 is a timing chart of signals in the semiconductor storage device according to the fourth embodiment.
Figure 11:
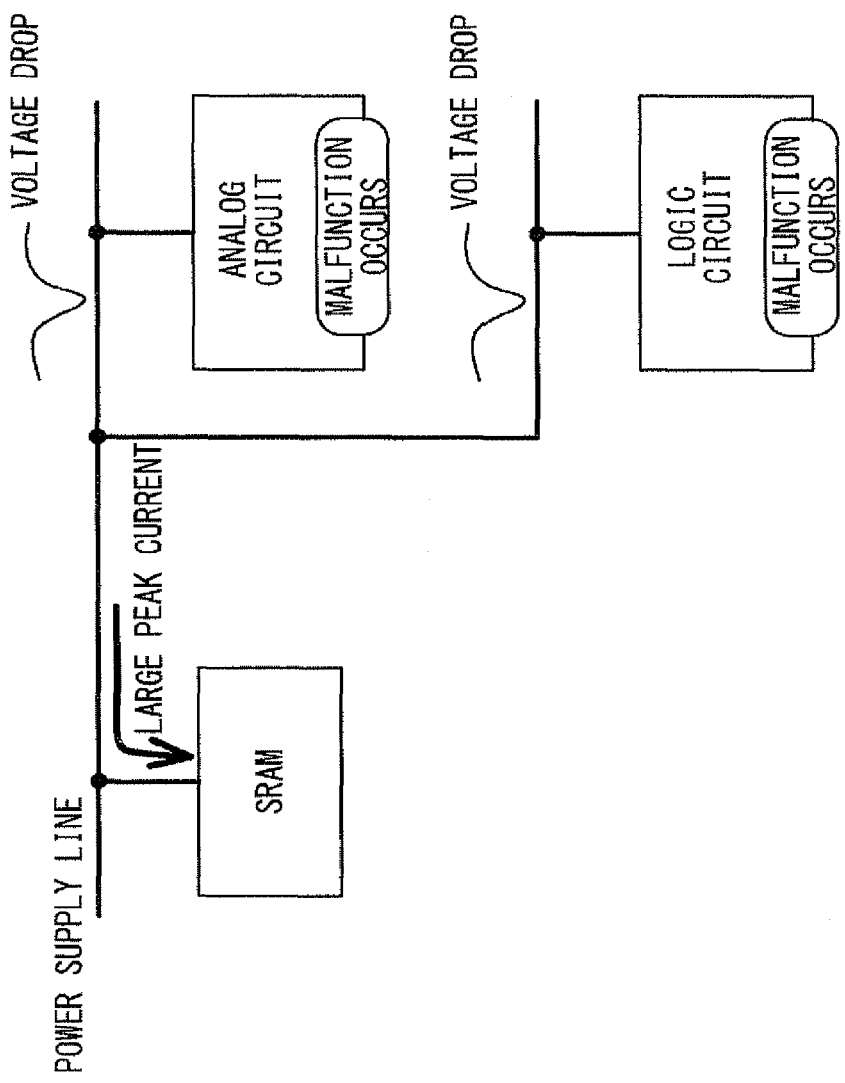
FIG. 11 is a diagram schematically showing a voltage drop during precharge in a semiconductor storage device.

The operation of the semiconductor storage device 400 is described hereinafter. FIG. 10 is a timing chart of signals in the semiconductor storage device 400 according to the fourth embodiment. The operation of the semiconductor storage device 400 except the source level control circuit 7 is the same as that of the semiconductor storage device 100 and thus not redundantly described. The operation of the source level control circuit 7 is described hereinbelow.

In the normal operation mode, the inverted operating mode switching signal RSI is High level. Thus, the source line ARVSS is driven to Low level by the source level control circuit 7.

When transition occurs from the normal operation mode to the resume standby mode (timing T1 in FIG. 10), the inverted operating mode switching signal RSI transitions from High level to Low level. Because the inverted operating mode switching signal RSI is Low level, the NMOS transistor N16 in the source level control circuit 7 is off, and the source line ARVSS is driven by the NMOS transistor N15 in diode connection. Accordingly, the potential of the source line ARVSS is determined by the ratio of a leakage current of the memory cell 1 and an on-current of the NMOS transistor N15 in diode connection. Therefore, the potential of the source line ARVSS rises to be higher than the ground potential VSS, and it is thereby possible to reduce a leakage current of the memory cell.

As described above, in this configuration, because the bit line BT and the bit line BB are in floating state in the resume standby mode just like in the semiconductor storage device 100, it is possible to reduce a leakage current from the bit line to the substrate of the transfer transistor due to GIDL.

Further, in this configuration, the potential of the source line ARVSS is raised to be higher than the ground potential VSS level by the source level control circuit 7 in the resume standby mode. It is thereby possible to reduce a leakage current due to a channel leakage as well. Therefore, further reduction of a leakage current can be achieved in this configuration.

Other Embodiments

The present invention is not limited to the above-described embodiments, and various changes and modifications may be made without departing from the scope of the invention. For example, the I/O circuit 2 and the operating mode control circuit 3 in the semiconductor storage device according to the third and fourth embodiments may be respectively replaced by the I/O circuit 4 and the operating mode control circuit 5 described in the second embodiment.

Further, both of the word line driver 6 and the source level control circuit 7 may be included in the semiconductor storage device according to the above-described embodiments.

The transistors described in the above embodiments are just examples. Various modifications, such as using other transistors or changing conductivity types, may be made as long as the same operation can be achieved.

Although embodiments of the present invention are described specifically in the foregoing, the present invention is not restricted to the above-described embodiments, and various changes and modifications may be made without departing from the scope of the invention.

The above-described embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A static random access memory circuit in a semiconductor device comprising:
a plurality of word lines;
a plurality of bit line pairs;
a plurality of memory cells coupled to the word lines and the bit line pairs such that one of the memory cells is coupled to one of the word lines and one bit line pair of the bit line pairs;
a plurality of I/O circuits connected to the bit line pairs, respectively, each of the I/O circuits including a precharge circuit; and
an operating control circuit coupled to a precharge circuit via a first power supply line and having a delay circuit which receives a first control signal and outputs a second control signal,
wherein the precharge circuit includes:
a first PMOS transistor having a source-drain path coupled between the first power supply line and one bit line of the one bit line pair,
a second PMOS transistor having a source-drain path coupled between the first power supply line and the other bit line of the one bit line pair, and
a third PMOS transistor having a source-drain path coupled between the one bit line and the other bit line,
wherein each of the first, second and third PMOS transistors has a gate coupled to receive a third control signal,
wherein the operating control circuit has:
a first MOS transistor coupled to the first power supply line and a first voltage point via a source-drain path of the first MOS transistor, and
a second MOS transistor coupled to the first power supply line and the first voltage point via a source-drain path of the second MOS transistor, and
wherein the first MOS transistor has a gate controlled based on the first and second control signals, and the second MOS transistor has a gate coupled to the first voltage point.

2. A static random access memory circuit according to claim 1,
wherein the delay circuit includes a plurality of buffers.

3. A static random access memory circuit according to claim 1, wherein each memory cells includes:
a flip-flop having:
a first storage node,
a second storage node,
a first CMOS inverter having an output coupled to the first storage node and an input coupled to the second storage node, and
a second CMOS inverter having an output coupled to the second storage node and an input coupled to the first storage node, the first CMOS inverter including a first load PMOS transistor and a first drive NMOS transistor, the second CMOS inverter including a second load PMOS transistor and a second drive NMOS transistor;

a first transfer NMOS transistor having a source-drain path coupled between the first storage node and the one bit line and having a gate coupled to one word line of the word lines, and a second transfer NMOS transistor having a source-drain path coupled between the second storage node and the other bit line and having a gate coupled to the one word line of the word lines, wherein the first and second load PMOS transistors have sources coupled to the first voltage point.

4. A static random access memory circuit according to claim 1, wherein each of the I/O circuits includes a write driver connected to one bit line pair of the bit line pairs via a first switch and a sense amplifier connected to one bit line pair of the bit line pairs via a second switch.

5. A static random access memory circuit according to claim 1, wherein each of the I/O circuits includes a I/O control circuit which outputs the third control signal.

6. A static random access memory circuit according to claim 5, wherein the I/O control circuit includes a first inverter which outputs the third control signal.

7. A static random access memory circuit according to claim 5, wherein the static random access memory circuit has a first mode and a second mode, wherein the first MOS transistor is turned on based on the first and second control signals when the static random access memory circuit is in the first mode, and wherein the second MOS transistor is turned off based on the first and second control signals when the static random access memory circuit is in the second mode.

8. A static random access memory circuit according to claim 1, wherein the static random access memory circuit has a first mode and a second mode, wherein the first MOS transistor is turned on based on the first and second control signals when the static random access memory circuit is in the first mode, and wherein the second MOS transistor is turned off based on the first and second control signals when the static random access memory circuit is in the second mode.

9. A static random access memory circuit according to claim 8, wherein the third control signal is a high level when the static random access memory circuit is in the second mode, and wherein the third control signal is a low level when the static random access memory circuit is in the first mode.

10. A static random access memory circuit according to claim 9, wherein the first mode is a normal operation mode, and the second mode is a resume standby mode.

* * * * *